United States Patent
Lee et al.

(10) Patent No.: US 11,509,314 B2
(45) Date of Patent: Nov. 22, 2022

(54) ALL-DIGITAL PHASE-LOCKED LOOP

(71) Applicant: Silicon Works Co., Ltd., Daejeon (KR)

(72) Inventors: Jong Suk Lee, Daejeon (KR); Young Bok Kim, Daejeon (KR); Chung Hwan Son, Daejeon (KR); Seok Jae Oh, Daejeon (KR); Yeh Ju Ka, Daejeon (KR)

(73) Assignee: Silicon Works Co., Ltd., Daejeon (KR)

( * ) Notice: Subject to any disclaimer, the term of this patent is extended or adjusted under 35 U.S.C. 154(b) by 0 days.

(21) Appl. No.: 17/389,698

(22) Filed: Jul. 30, 2021

(65) Prior Publication Data

US 2022/0038104 A1 Feb. 3, 2022

(30) Foreign Application Priority Data

Jul. 30, 2020 (KR) .................. 10-2020-0094932

(51) Int. Cl.
*H03L 7/085* (2006.01)
*H03L 7/099* (2006.01)

(52) U.S. Cl.
CPC .............. *H03L 7/085* (2013.01); *H03L 7/099* (2013.01); *H03L 2207/50* (2013.01)

(58) Field of Classification Search
CPC ......... H03L 7/085; H03L 7/091; H03L 7/093; H03L 7/099; H03L 7/0991; H03L 7/08; H03L 2207/00; H03L 2207/50
See application file for complete search history.

(56) References Cited

U.S. PATENT DOCUMENTS 9,673,827 B2 * 6/2017 Sim .................. H03L 7/23

FOREIGN PATENT DOCUMENTS

| KR | 2009-0033783 A | 4/2009 |
| KR | 2020-0045259 A | 5/2020 |

* cited by examiner

*Primary Examiner* — Diana J. Cheng
(74) *Attorney, Agent, or Firm* — Polsinelli PC

(57) ABSTRACT

The present disclosure discloses an all-digital phase-locked loop. The all-digital phase-locked loop may include a time-to-digital conversion circuit configured to convert phase differences between a reference signal and a feedback signal into respective digital values and to output a first data signal and a second data signal corresponding to the respective digital values, a digital loop filter configured to select one of the first data signal and the second data signal as valid data and output a control signal by operating the valid data and a first register signal, a digitally controlled oscillator configured to generate an oscillation signal and control a frequency of the oscillation signal in response to the control signal, and a divider configured to divide the oscillation signal and output the feedback signal to the time-to-digital conversion circuit.

15 Claims, 7 Drawing Sheets

ALL-DIGITAL PHASE-LOCKED LOOP

BACKGROUND

1. Technical Field

The present disclosure relates to an all-digital phase-locked loop, and more particularly, to an all-digital phase-locked loop which can be verified easily and at a high speed by using a digital loop filter.

2. Related Art

In general, a phase-locked loop outputs a stabilized oscillation signal having the same frequency as a reference signal.

The phase-locked loop may be adopted for the source driver of a display apparatus, and may be used to recover a clock signal by a frequency multiplication of an input signal.

A digital phase-locked loop may include a digital loop filter. The digital loop filter may output a control signal that determines an oscillation frequency of a digitally controlled oscillator by using a digital signal corresponding to a phase difference between a reference signal and a feedback signal.

However, a digital loop filter according to a conventional technology is implemented using a signal synthesis block for digital coding, an integrator and an adder, and thus has problems in that complexity and a calculation time are increased due to the mixture of the signal synthesis block for digital coding and circuits upon verification of a phase-locked loop.

SUMMARY

Various embodiments are directed to providing an all-digital phase-locked loop which can be verified easily and at a high speed by using a digital loop filter.

In an embodiment, a digital loop filter in an all-digital phase-locked loop may include a selection circuit configured to output one of a first data signal and a second data signal as valid data, a first operation circuit configured to output a first operation signal by adding or subtracting the valid data and a first register signal, a first register circuit configured to store the first operation signal and output the first operation signal as the first register signal, a second operation circuit configured to output a second operation signal by adding or subtracting a value of at least one bit of the valid data and the first register signal, and a second register circuit configured to store the second operation signal and output the second operation signal as a control signal.

In an embodiment, a digital loop filter in an all-digital phase-locked loop may include a selection circuit configured to receive a first data signal and a second data signal corresponding to a phase difference between a reference signal and a feedback signal and output one of the first data signal and the second data signal as valid data, a frequency-integral path configured to store a first operation signal obtained by adding or subtracting a value of the valid data and a first register signal and output a first register signal corresponding to the first operation signal, and a proportional path configured to store a second operation signal obtained by adding or subtracting a value of at least one lower bit of the valid data and the first register signal and output a control signal corresponding to the second operation signal.

In an embodiment, an all-digital phase-locked loop may include a time-to-digital conversion circuit configured to convert a phase difference between a reference signal and a feedback signal into digital value and output a first data signal and a second data signal corresponding to the digital value, a digital loop filter configured to select one of the first data signal and the second data signal as valid data and output a control signal by operating the valid data and a first register signal, a digitally controlled oscillator configured to generate an oscillation signal and control a frequency of the oscillation signal in response to the control signal, and a divider configured to output the feedback signal to the time-to-digital conversion circuit by dividing the oscillation signal.

In an embodiment, an all-digital phase-locked loop may include a clock generator configured to generate a first clock signal, a second clock signal and a third clock signal by using a reference signal, a first time-to-digital conversion circuit configured to output a first data signal corresponding to a digital value when the reference signal has an earlier phase than a feedback signal in response to the first clock signal, a second time-to-digital conversion circuit configured to output a second data signal corresponding to a digital value when the reference signal has a later phase than the feedback signal in response to the first clock signal, a digital loop filter configured to perform an operation by using the first data signal or the second data signal in response to the second clock signal and output a control signal in response to the third clock signal, and a digitally controlled oscillator configured to control a frequency of an oscillation signal in response to the control signal and output the oscillation signal.

As described above, according to embodiments, the digital loop filter can verify the all-digital phase-locked loop easily and at a high speed because the digital loop filter can be implemented using digital circuits without a signal synthesis block for digital coding.

DETAILED DESCRIPTION

Embodiments provide a digital loop filter capable of verifying an all-digital phase-locked loop easily and at a high speed and an all-digital phase-locked loop including the same.

The digital loop filter may be configured to output a control signal VCON that determines an oscillation frequency of a digitally controlled oscillator by using a digital signal corresponding to a phase difference between a reference signal REF and a feedback signal FEB. In this case, the reference signal REF and the feedback signal FEB may be understood with reference to FIGS. 5 and 6 to be described later. The reference signal REF may be understood as an input signal to the digital loop filter. The feedback signal FEB may be understood as a feedback signal of an output signal from the digital loop filter.

In embodiments, a first data signal may be defined as a digital value corresponding to a phase difference between the reference signal and the feedback signal when the reference signal has an earlier phase than the feedback signal. A second data signal may be defined as a digital value corresponding to a phase difference between the reference signal and the feedback signal when the reference signal has a later phase than the feedback signal.

In embodiments, terms, such as a first and a second, may be used to distinguish between various elements. The elements are not limited by terms, such as a first and a second.

Figure 1:
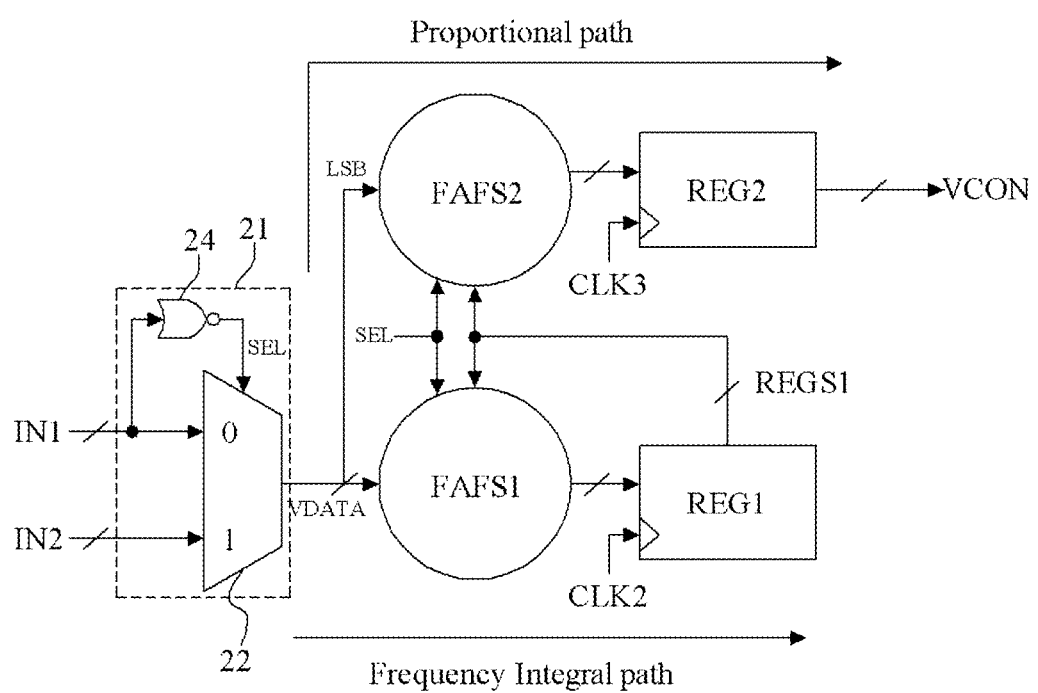
FIG. 1 is a block diagram of a digital loop filter in an all-digital phase-locked loop according to an embodiment.

FIG. 1 is a block diagram of a digital loop filter 20 in an all-digital phase-locked loop according to an embodiment.

The digital loop filter 20 may output a control signal VCON that determines an oscillation frequency of a digitally controlled oscillator by using a first data signal IN1 and a second data signal IN2.

Figure 5:
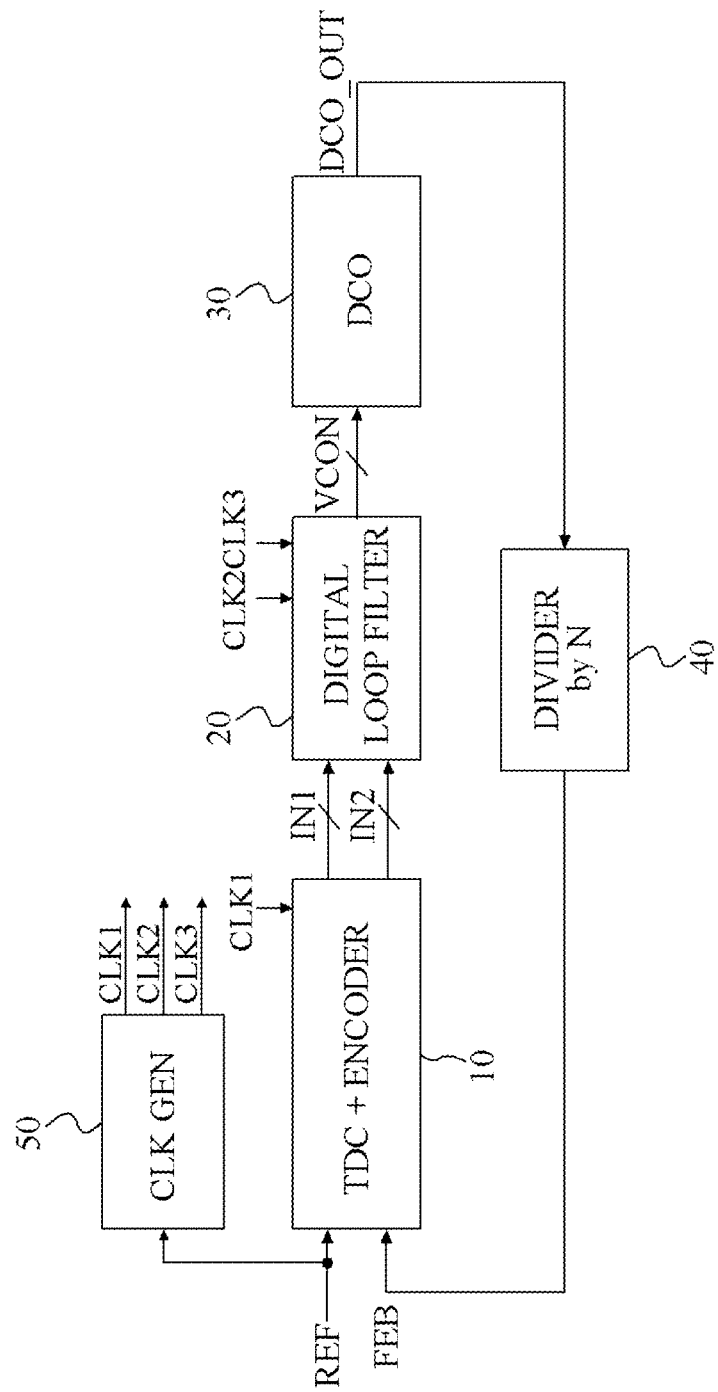
FIG. 5 is a block diagram of an all-digital phase-locked loop according to an embodiment.

In this case, each of the first data signal IN1 and the second data signal IN2 is a digital value corresponding to a phase difference between a reference signal REF and a feedback signal FEB, and may be received from a time-to-digital conversion circuit 10 (refer to a description given with reference to FIG. 5).

Referring to FIG. 1, the digital loop filter 20 may include a selection circuit 21, a first operation circuit FAFS1, a first register circuit REG1, a second operation circuit FAFS2 and a second register circuit REG2.

First, the selection circuit 21 may select one of the first data signal IN1 and the second data signal IN2 as valid data VDATA on the basis of a value of the first data signal IN1.

The selection circuit 21 may receive the first data signal IN1 and the second data signal IN2 from the time-to-digital conversion circuit 10 (refer to FIG. 5). The time-to-digital conversion circuit 10 may convert a phase difference between the reference signal REF and the feedback signal FEB into a digital value, may store the digital value, and may provide the digital loop filter 20 with the first data signal IN1, corresponding to the digital value, and the second data signal IN2 in response to a first clock signal CLK1.

The selection circuit 21 may receive the first data signal IN1 as a digital value corresponding to a phase difference between the reference signal REF and the feedback signal FEB when the reference signal REF has an earlier phase than the feedback signal FEB, and may receive the second data signal IN2 as a digital value corresponding to a phase difference between the reference signal REF and the feedback signal FEB when the reference signal REF has a later phase than the feedback signal FEB.

The selection circuit 21 may select the first data signal IN1 or the second data signal IN2 as the valid data VDATA on the basis of a value of the first data signal IN1, that is, a digital value corresponding to a phase difference between the reference signal REF and the feedback signal FEB.

For example, the selection circuit 21 may select the first data signal IN1 as the valid data VDATA when the reference signal REF has an earlier phase than the feedback signal FEB. Furthermore, the selection circuit 21 may select the second data signal IN2 as the valid data VDATA when the reference signal REF has a later phase than the feedback signal FEB.

The selection circuit 21 may include a logic circuit 24 and a multiplexer 22.

The logic circuit 24 may output a selection signal SEL corresponds to a result of a logical operation of values of bits of the first data signal IN1. For example, the logic circuit 24 may include a NOR operation circuit.

The multiplexer 22 may output the first data signal IN1 or the second data signal IN2 as the valid data VDATA in response to the selection signal SEL.

For example, the selection circuit 21 may receive the first data signal IN1 having a value of "00000 . . . " when the reference signal REF has a later phase than the feedback signal FEB, and may receive the second data signal IN2 as a digital value corresponding to a phase difference between the reference signal REF and the feedback signal FEB.

The logic circuit 24 may output the selection signal SEL having a high logic level by performing a NOR operation on the first data signal IN1 having a value of "00000 . . . ."

The multiplexer 22 may output the second data signal IN2 as the valid data VDATA in response to the selection signal SEL having a high logic level.

Furthermore, the selection circuit 21 may receive the first data signal IN1 as a digital value corresponding to a phase difference between the reference signal REF and the feedback signal FEB when the reference signal REF has an earlier phase than the feedback signal FEB.

The logic circuit 24 may output the selection signal SEL having a low logic level because the logic circuit 24 performs a NOR operation on the first data signal IN1 having a digital value corresponding to a phase difference when the reference signal REF has an earlier phase than the feedback signal FEB.

The multiplexer 22 may output the first data signal IN1 as the valid data VDATA in response to the selection signal SEL having a low logic level.

The first operation circuit FAFS1 may output a first operation signal by adding or subtracting the valid data VDATA and a stored value. It may be understood that the stored value corresponds to a first register signal REGS1 received from the first register circuit REG1.

The first register circuit REG1 may store the first operation signal, and may output the first operation signal as the first register signal REGS1 in response to a second clock signal CLK2. The second clock signal CLK2 may be received when the operation of the first operation circuit FAFS1 is terminated.

The first register circuit REG1 may provide the first register signal REGS1 to the first operation circuit FAFS1 and the second operation circuit FAFS2.

The second operation circuit FAFS2 may output a second operation signal by adding or subtracting a value of at least one bit of the valid data VDATA and the first register signal REGS1. The value of the at least one bit may be set as a value of the least significant bit (LSB) of the valid data VDATA.

The second register circuit REG2 may store the second operation signal, and may output the second operation signal as the control signal VCON in response to a third clock signal CLK3. The third clock signal CLK3 may be received when the operation of the second operation circuit FAFS2 is terminated.

The first operation circuit FAFS1 and the second operation circuit FAFS2 may each operate as an adder or a subtractor depending on whether the first data signal IN1 or the second data signal IN2 is selected as the valid data VDATA.

The first operation circuit FAFS1 and the second operation circuit FAFS2 may each operate as an adder when the first data signal IN1 is selected as the valid data VDATA, and may each operate as a subtractor when the second data signal IN2 is selected as the valid data VDATA.

The first operation circuit FAFS1 and the second operation circuit FAFS2 may receive the selection signal SEL from the logic circuit 24 of the selection circuit 21, and may each operate as the adder or the subtractor in response to a logic level of the selection signal SEL.

As a result, the first operation circuit FAFS1 and the second operation circuit FAFS2 may each operate as the adder when the reference signal REF has an earlier phase than the feedback signal FEB, and may each operate as the subtractor when the reference signal REF has a later phase than the feedback signal FEB.

The first operation circuit FAFS1 and the first register circuit REG1 may be used as a frequency-integral path. The second operation circuit FAFS2 and the second register circuit REG2 may be used as a proportional path.

In the frequency-integral path, the first operation circuit FAFS1 may add or subtract the valid data VDATA and the first register signal REGS1, so that a first operation signal is generated. The first operation signal may be stored in the first register circuit REG1. The first operation signal of the first register circuit REG1 may be output as the first register signal REGS1 in response to the second clock signal CLK2.

In the proportional path, the second operation circuit FAFS2 may add or subtract a value of the least significant bit (LSB) of the valid data VDATA and the first register signal REGS1, so that a second operation signal is generated. The second operation signal may be stored in the second register circuit REG2. The second operation signal of the second register circuit REG2 may be output as the control signal VCON in response to the third clock signal CLK3.

In the frequency-integral path and the proportional path, the first operation circuit FAFS1 and the second operation circuit FAFS2 may each operate as an adder when the reference signal REF has an earlier phase than the feedback signal FEB, and may each operate as a subtractor when the reference signal REF has a later phase than the feedback signal FEB.

Figure 2:
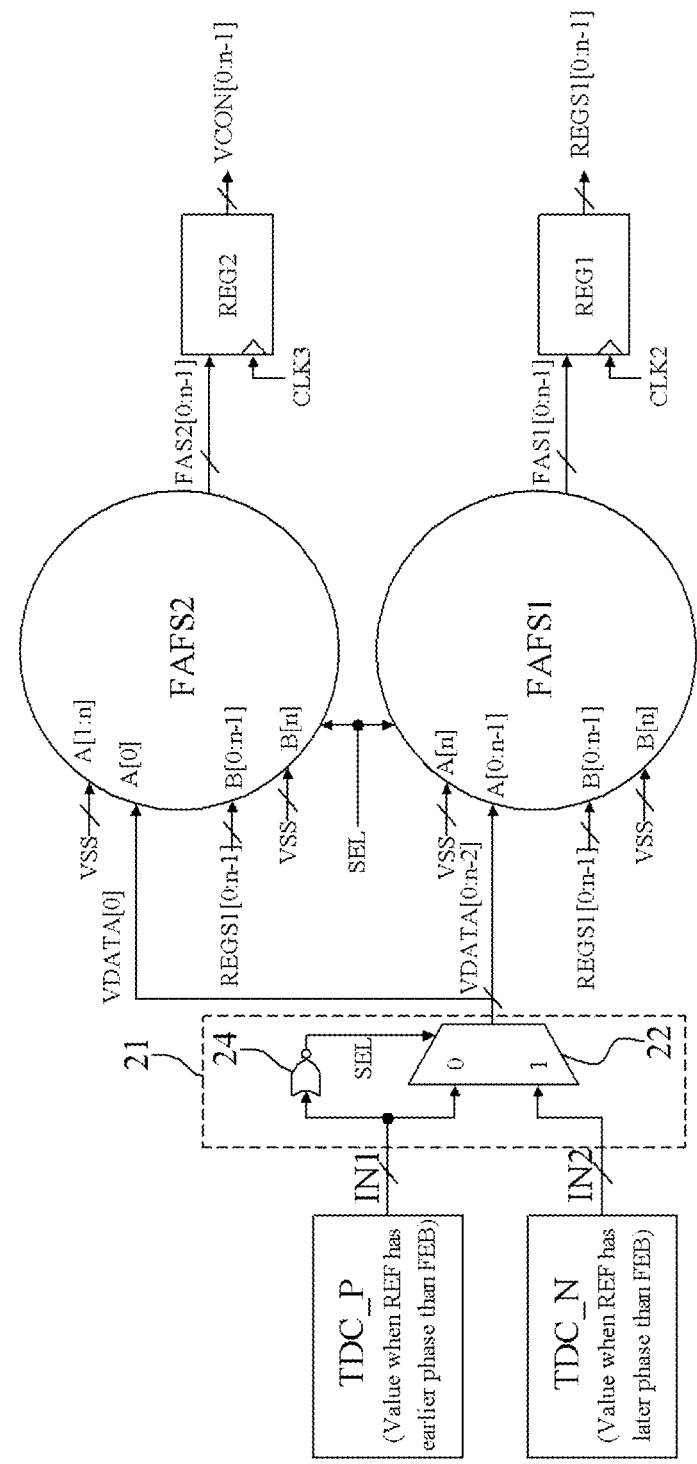
FIG. 2 is a detailed block diagram of the digital loop filter in an all-digital phase-locked loop according to an embodiment.

FIG. 2 is a detailed block diagram of the digital loop filter 20 in an all-digital phase-locked loop according to an embodiment.

Referring to FIG. 2, the digital loop filter 20 may receive, from a first time-to-digital conversion circuit TDC_P, the first data signal IN1 as a digital value corresponding to a phase difference between the reference signal REF and the feedback signal FEB when the reference signal REF has an earlier phase than the feedback signal FEB.

Furthermore, the digital loop filter 20 may receive, from a second time-to-digital conversion circuit TDC_N, the second data signal IN2 as a digital value corresponding to a phase difference between the reference signal REF and the feedback signal FEB when the reference signal REF has a later phase than the feedback signal FEB.

The selection circuit 21 may select the first data signal IN1 or the second data signal IN2 as the valid data VDATA on the basis of a value of the first data signal IN1 by using the logic circuit 24 and the multiplexer 22.

The first operation circuit FAFS1 may output the first operation signal FAS1[0:$n$-1] by adding or subtracting values of preset bits VDATA[0:$n$-2] of the valid data VDATA and a stored value received as the first register signal REGS1 from the first register circuit REG1. The first operation circuit FAFS1 may receive the stored value, that is, a value of the first register signal REGS1[0:$n$-1], from the first register circuit REG1.

The first register circuit REG1 may store the first operation signal FAS1[0:$n$-1], and may output the first operation signal FAS1[0:$n$-1] as the first register signal REGS1[0:$n$-1] in response to the second clock signal CLK2.

The first register circuit REG1 may receive the second clock signal CLK2 when the operation of the first operation circuit FAFS1 is terminated.

The first register circuit REG1 may provide the first register signal REGS1[0:$n$-1] to the first operation circuit FAFS1 and the second operation circuit FAFS2.

The second operation circuit FAFS2 may output the second operation signal FAS2[0:$n$-1] to the second register circuit REG2 by adding or subtracting a value of the LSB VDATA[0] of the valid data VDATA and the first register signal REGS1[0:$n$-1].

The second register circuit REG2 may store the second operation signal FAS2[0:$n$-1], and may output the second operation signal FAS2[0:$n$-1] as the control signal VCON in response to the third clock signal CLK3.

The second register circuit REG2 may receive the third clock signal CLK3 when the operation of the second operation circuit FAFS2 is terminated.

The first operation circuit FAFS1 and the second operation circuit FAFS2 may receive the selection signal SEL from the logic circuit 24 of the selection circuit 21, and may each operate as an adder or a subtractor in response to a logic level of the selection signal SEL.

The first operation circuit FAFS1 and the second operation circuit FAFS2 may each operate as an adder in response to the selection signal SEL having a low logic level when the first data signal IN1 is selected as the valid data VDATA.

The first operation circuit FAFS1 and the second operation circuit FAFS2 may each operate as a subtractor in response to the selection signal SEL having a high logic level when the second data signal IN2 is selected as the valid data VDATA.

That is, when the reference signal REF has an earlier phase than the feedback signal FEB, the first data signal IN1 may be selected as the valid data VDATA, and the first operation circuit FAFS1 and the second operation circuit FAFS2 may each operate as an adder. When the reference signal REF has a later phase than the feedback signal FEB, the second data signal IN2 may be selected as the valid data VDATA, and the first operation circuit FAFS1 and the second operation circuit FAFS2 may each operate as a subtractor.

As described above, the digital loop filter 20 can verify a digital phase-locked loop easily and at a high speed because the digital loop filter 20 can be implemented using digital circuits, such as an adder, a subtractor, and a register, without a signal synthesis block for digital coding.

In the first operation circuit FAFS1 and the second operation circuits FAFS2, A[0] and A[1:$n$] correspond to a first input signal A, and B[0:$n$-1] and B[$n$] correspond to a second input signal B. The first input signal A and the second input signal B will be described in reference to FIG. 4. It can be understood that the number of bits in the first input signal A and the second input signal B is the same. Furthermore, VSS can be understood as a fixed value corresponding to A[1:$n$] and B[1:$n$], respectively.

Figure 3:
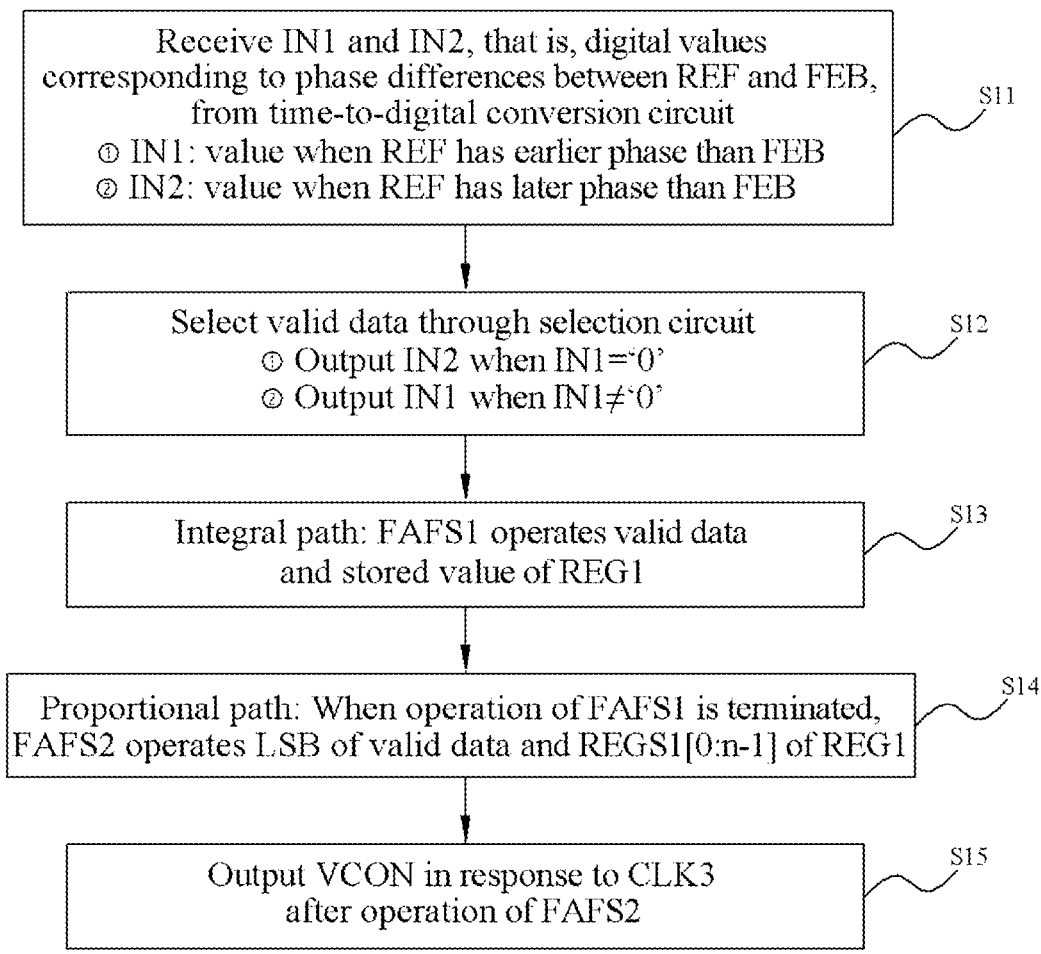
FIG. 3 is a flowchart for describing an operation of the digital loop filter in an all-digital phase-locked loop according to an embodiment.

FIG. 3 is a flowchart for describing an operation of the digital loop filter 20 in an all-digital phase-locked loop according to an embodiment.

First, the digital loop filter 20 receives the first data signal IN1 and the second data signal IN2, that is, digital values respectively corresponding to phase differences between the reference signal REF and the feedback signal FEB through the time-to-digital conversion circuits (S11).

Next, the digital loop filter 20 selects the valid data VDATA through the selection circuit 21 (S12). For example, the digital loop filter 20 outputs the second data signal IN2 as the valid data VDATA when a value of the first data signal IN1 is "0", and outputs the first data signal IN1 as the valid data VDATA when a value of the first data signal IN1 is not "0."

In the frequency-integral path, the first operation circuit FAFS1 adds or subtracts values of preset bits VDATA[0:$n$-2] of the valid data VDATA and a stored value of the first register circuit REG1, and stores the first operation signal FAS1[0:$n$-1] in the first register circuit REG1 (S13).

Furthermore, in the proportional path, the second operation circuit FAFS2 receives the first register signal REGS1[0:$n$-1] provided in response to the second clock signal CLK2 when the operation of the first operation circuit FAFS1 is terminated, adds or subtracts the first register signal REGS1[0:$n$-1] and values of the LSB of the valid data VDATA, and stores the second operation signal FAS2[0:$n$-1] in the second register circuit REG2 (S14).

After the operation of the second operation circuit FAFS2, the digital loop filter 20 outputs the control signal VCON in response to the third clock signal CLK3 (S15).

Figure 4:
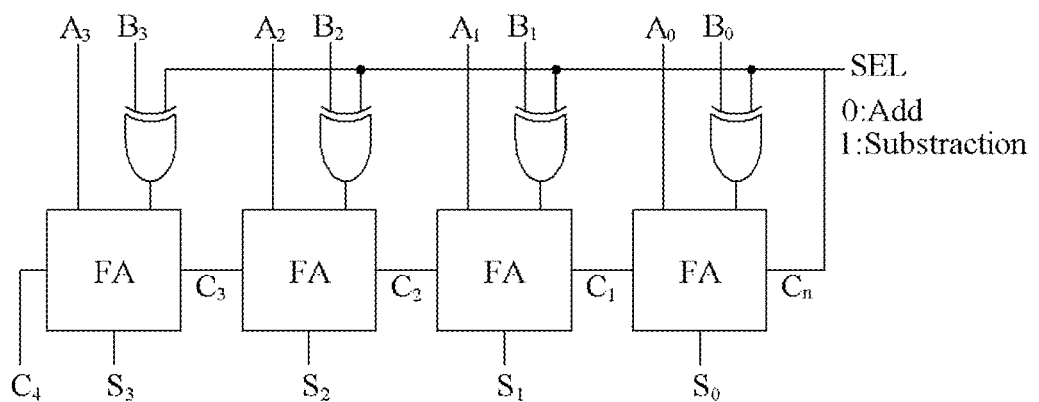
FIG. 4 is a circuit diagram of an operation circuit illustrated in FIGS. 1 and 2.

FIG. 4 is a circuit diagram of the operation circuit illustrated in FIGS. 1 and 2.

Referring to FIG. 4, the operation circuit may operate as an adder or a subtractor in response to the selection signal SEL.

For example, the operation circuit may operate as an adder for adding a first input signal A and a second input signal B when receiving the selection signal SEL having a low logic level, and may operate as a subtractor for adding inverted signals of the first input signal A and the second input signal B, that is, subtracting the first input signal A and the second input signal B when receiving the selection signal SEL having a high logic level.

In FIG. 4, FA is the adder. Each of A0, A1, A2 and A3 corresponds to the first input signal A. Each of B0, B1, B2 and B3 corresponds to the second input signal B. Each of S0, S1, S2 and S3 corresponds to an output signal of the operation circuit. Furthermore, each of Cn, C0, C1, C2, C3 and C4 corresponds to a shifted signal of the selection signal SEL for control of the adders FA.

FIG. 5 is a block diagram of an all-digital phase-locked loop according to an embodiment.

Referring to FIG. 5, the digital phase-locked loop may include a time-to-digital conversion circuit 10, the digital loop filter 20, a digitally controlled oscillator (DCO) 30, a divider 40 and a clock generator 50.

The time-to-digital conversion circuit 10 may convert a phase difference between the reference signal REF and the feedback signal FEB into a digital value, and may output, to the digital loop filter 20, the first data signal IN1 corresponding to the digital value and the second data signal IN2.

The time-to-digital conversion circuit 10 may output the first data signal IN1 as a digital value when the reference signal REF has an earlier phase than the feedback signal FEB, and may output the second data signal IN2 as a digital value when the reference signal REF has a later phase than the feedback signal FEB.

The digital loop filter 20 may select one of the first data signal IN1 and the second data signal IN2 as the valid data VDATA, and may output the control signal VCON by operating the valid data VDATA and a stored value.

The DCO 30 may generate an oscillation signal DCO_OUT, and may control the frequency of the oscillation signal DCO_OUT in response to the control signal VCON.

The divider 40 may generate the feedback signal FEB by dividing the oscillation signal DCO_OUT by a preset division ratio N (N is a natural number), and may output the feedback signal FEB to the time-to-digital conversion circuit 10. The division ratio N may be determined depending on a protocol between an external device and an application that adopts a phase-locked loop.

The clock generator 50 may receive the reference signal REF, and may generate the first clock signal CLK1, the second clock signal CLK2 and the third clock signal CLK3 by using the reference signal REF.

The clock generator 50 may provide the first clock signal CLK1 to the time-to-digital conversion circuit 10, and may provide the second clock signal CLK2 and the third clock signal CLK3 to the digital loop filter 20.

The time-to-digital conversion circuit 10 may output the first data signal IN1 and the second data signal IN2 to the digital loop filter 20 in response to the first clock signal CLK1.

The digital loop filter 20 may perform an operation in response to the second clock signal CLK2, and may provide the control signal VCON to the DCO 30 in response to the third clock signal CLK3.

Figure 6:
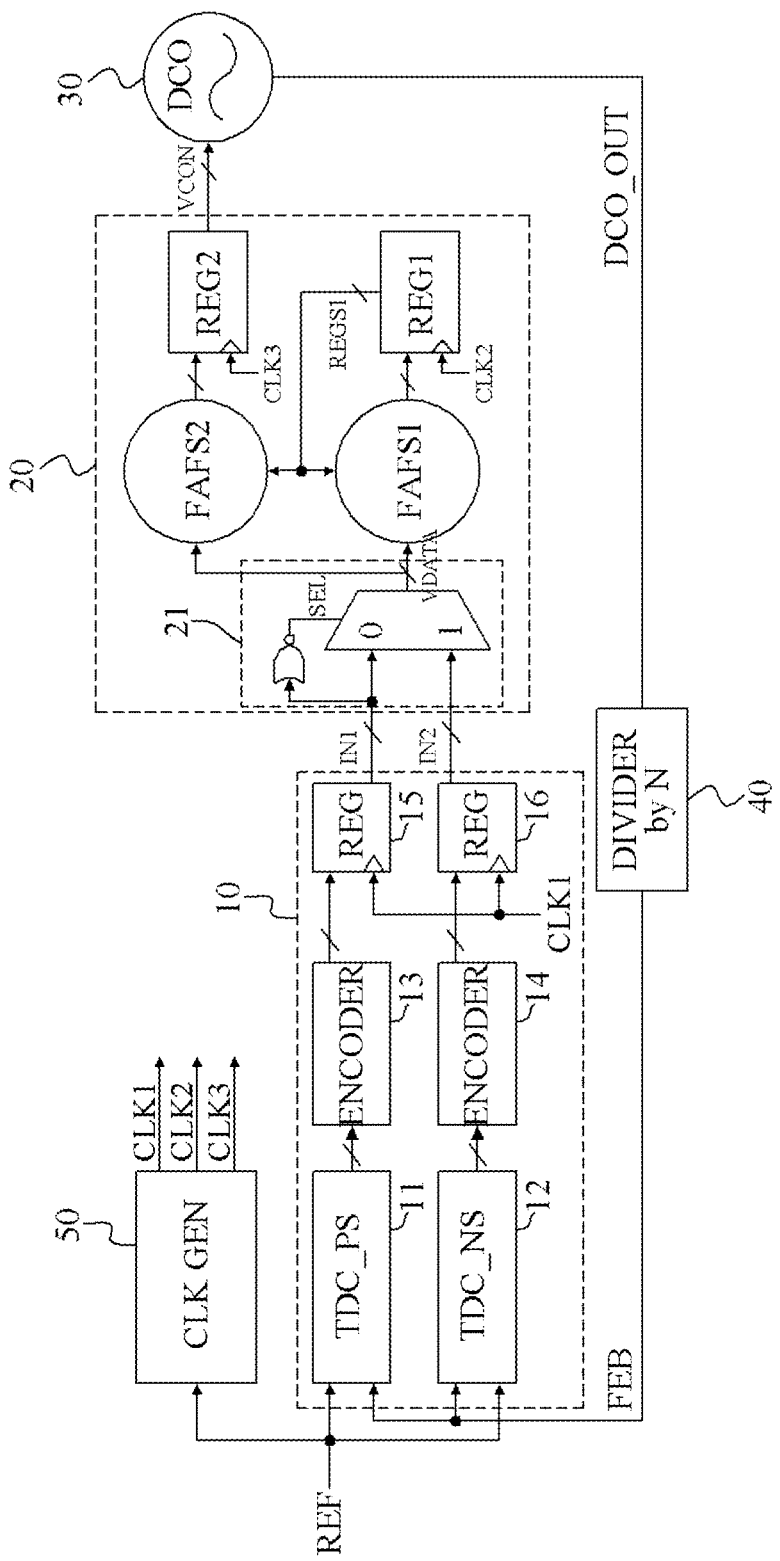
FIG. 6 is a detailed block diagram of the all-digital phase-locked loop according to an embodiment.

FIG. 6 is a detailed block diagram of the all-digital phase-locked loop according to an embodiment.

Referring to FIG. 6, the digital phase-locked loop may include the time-to-digital conversion circuit 10, the digital loop filter 20, the DCO 30, the divider 40 and the clock generator 50.

The time-to-digital conversion circuit 10 may include a first time-to-digital conversion circuit and a second time-to-digital conversion circuit. The first time-to-digital conversion circuit corresponds to the first time-to-digital conversion circuit TDC_P of FIG. 2, and the second time-to-digital conversion circuit corresponds to the second time-to-digital conversion circuit TDC_N of FIG. 2.

The first time-to-digital conversion circuit may output the first data signal IN1 as a digital value when the reference signal REF has an earlier phase than the feedback signal FEB. The second time-to-digital conversion circuit may output the second data signal IN2 as a digital value when the reference signal REF has a later phase than the feedback signal FEB.

The first time-to-digital conversion circuit may include a positive time-to-digital converter TDC_PS 11, a first encoder 13 and a first register 15.

The positive time-to-digital converter 11 may convert a phase difference between the reference signal REF and the feedback signal FEB into a digital value. The first encoder 13 may convert the digital value of the positive time-to-digital converter 11 into a binary number.

The first register 15 may store the binary number of the first encoder 13, and may output the binary number of the first encoder 13 as the first data signal IN1 in response to the first clock signal CLK1.

The second time-to-digital conversion circuit may include a negative time-to-digital converter TDC_NS 12, a second encoder 14 and a second register 16.

The negative time-to-digital converter 12 may convert a phase difference between the reference signal REF and the feedback signal FEB into a digital value. The second encoder 14 may convert the digital value of the negative time-to-digital converter 12 into a binary number.

The second register 16 may store the binary number of the second encoder 14, and may output the binary number of the second encoder 14 as the second data signal IN2 in response to the first clock signal CLK1.

The digital loop filter 20 may include the selection circuit 21, the first operation circuit FAFS1, the first register circuit REG1, the second operation circuit FAFS2 and the second register circuit REG2.

The selection circuit 21 may select one of the first data signal IN1 and the second data signal IN2 as the valid data VDATA on the basis of a value of the first data signal IN1.

The selection circuit 21 may select the first data signal IN1 as the valid data VDATA when the reference signal REF has an earlier phase than the feedback signal FEB. Furthermore, the selection circuit 21 may select the second data signal IN2 as the valid data VDATA when the reference signal REF has a later phase than the feedback signal FEB.

The first operation circuit FAFS1 may output a first operation signal by adding or subtracting the valid data VDATA and a stored value of the first register circuit REG1.

The first register circuit REG1 may store the first operation signal, and may output the first operation signal, as the first register signal REGS1, to the second operation circuit FAFS2 in response to the second clock signal CLK2.

The second operation circuit FAFS2 may output a second operation signal by adding or subtracting a value of the LSB of the valid data VDATA and the output signal of the first register circuit REG1.

The second register circuit REG2 may store the second operation signal, and may output the second operation signal as the control signal VCON in response to the third clock signal CLK3.

The first operation circuit FAFS1 and the second operation circuit FAFS2 may each operate as an adder or a subtractor depending on whether the first data signal IN1 or the second data signal IN2 is selected as the valid data VDATA.

The first operation circuit FAFS1 and the second operation circuit FAFS2 may each operate as the adder when the first data signal IN1 is selected as the valid data VDATA, and may each operate as the subtractor when the second data signal IN2 is selected as the valid data VDATA.

The DCO 30 may control the frequency of the oscillation signal DCO_OUT in response to the control signal VCON, and may provide the oscillation signal DCO_OUT to the divider 40.

The divider 40 may provide the time-to-digital conversion circuit 10 with the feedback signal FEB obtained by dividing the oscillation signal DCO_OUT by a preset division ratio N.

The clock generator 50 may generate the first clock signal CLK1, the second clock signal CLK2 and the third clock signal CLK3 by using the reference signal REF, may provide the first clock signal CLK1 to the time-to-digital conversion circuit 10, and may provide the second clock signal CLK2 and the third clock signal CLK3 to the digital loop filter 20.

The time-to-digital conversion circuit 10 may provide the digital loop filter 20 with the first data signal IN1 and the second data signal IN2 in response to the first clock signal CLK1 of the clock generator 50.

The digital loop filter 20 may perform an operation in response to the second clock signal CLK2 of the clock generator 50, and may provide the control signal VCON to the DCO 30 in response to the third clock signal CLK3.

Figure 7:
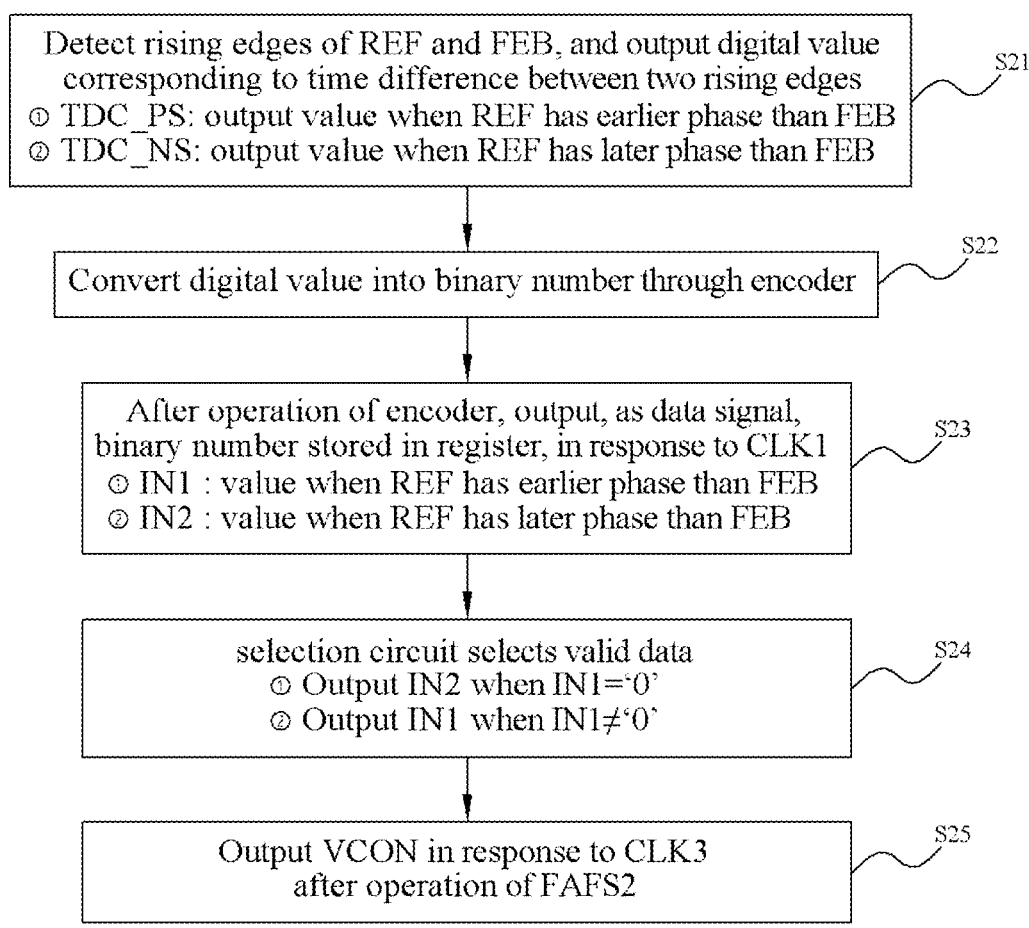
FIG. 7 is a flowchart for describing an operation of the all-digital phase-locked loop according to an embodiment.

FIG. 7 is a flowchart for describing an operation of the all-digital phase-locked loop according to an embodiment.

Referring to FIG. 7, the all-digital phase-locked loop may detect rising edges of the reference signal REF and the feedback signal FEB through the positive time-to-digital converter TDC_PS 11 and the negative time-to-digital converter TDC_NS 12, respectively, and may output a digital value corresponding to a time difference between the two rising edges (S21).

The positive time-to-digital converter TDC_PS 11 outputs a digital value corresponding to a phase difference between the reference signal REF and the feedback signal FEB when the reference signal REF has an earlier phase than the feedback signal FEB. The negative time-to-digital converter TDC_NS 12 outputs a digital value corresponding to a phase difference between the reference signal REF and the feedback signal FEB when the reference signal REF has a later phase than the feedback signal FEB.

Next, the all-digital phase-locked loop may convert, into binary numbers, the digital values corresponding to the phase differences through the encoders 13 and 14, respectively, (S22).

Next, the all-digital phase-locked loop may output the binary numbers, stored in the first register 15 and the second register 16, as the first data signal IN1 and the second data signal IN2, respectively, to the digital loop filter 20 in response to the first clock signal CLK1 received after operations of the time-to-digital converters 11 and 12 and the encoder 13 and 14 (S23).

Next, the all-digital phase-locked loop may select one of the first data signal IN1 and the second data signal IN2 as the valid data VDATA on the basis of a value of the first data signal IN1 through the selection circuit 21 (S24).

Next, the all-digital phase-locked loop may output, to the DCO 30, the control signal VCON corresponding to an operation signal of the second operation circuit FAFS2 in response to the third clock signal CLK3 after an operation of the second operation circuit FAFS2 (S25).

As described above, according to embodiments, the digital loop filter can verify the all-digital phase-locked loop easily and at a high speed because the digital loop filter can be implemented using digital circuits without a signal synthesis block for digital coding.

What is claimed is:

1. An all-digital phase-locked loop comprising:
   a time-to-digital conversion circuit configured to convert a phase difference between a reference signal and a feedback signal into digital value, and output a first data signal and a second data signal corresponding to the digital value;
   a digital loop filter configured to select one of the first data signal and the second data signal as valid data and output a control signal by operating the valid data and a first register signal;
   a digitally controlled oscillator configured to generate an oscillation signal and control a frequency of the oscillation signal in response to the control signal; and
   a divider configured to divide the oscillation signal and output the feedback signal to the time-to-digital conversion circuit,
   wherein the time-to-digital conversion circuit
   outputs the first data signal as a first digital value when the reference signal has an earlier phase than the feedback signal, and
   outputs the second data signal as a second digital value when the reference signal has a later phase than the feedback signal.

2. The all-digital phase-locked loop of claim 1, wherein the time-to-digital conversion circuit comprises:
a positive time-to-digital converter configured to convert the phase difference into he first digital value;
a first encoder configured to convert the first digital value into a binary number; and
a first register configured to store the binary number of the first encoder and output the stored value as the first data signal in response to a first clock signal.

3. The all-digital phase-locked loop of claim 1, wherein the time-to-digital conversion circuit comprises:
a negative time-to-digital converter configured to convert the phase difference into the second digital value;
a second encoder configured to convert the second digital value into a binary number; and
a second register configured to store the binary number of the second encoder and output the stored value as the second data signal in response to a first clock signal.

4. The all-digital phase-locked loop of claim 1, wherein the digital loop filter comprises:
a selection circuit configured to select one of the first data signal and the second data signal as the valid data;
a first operation circuit configured to output a first operation signal by operating the valid data and the first register signal;
a first register circuit configured to store the first operation signal and output the first operation signal as the first register signal in response to a second clock signal;
a second operation circuit configured to output a second operation signal by operating a value of at least one bit of the valid data and the first register signal; and
a second register circuit configured to store the second operation signal and output the second operation signal as the control signal in response to a third clock signal.

5. The all-digital phase-locked loop of claim 4, wherein the first operation circuit and the second operation circuit
each operate as an adder when the reference signal has an earlier phase than the feedback signal, and
each operate as a subtractor when the reference signal has a later phase than the feedback signal.

6. The all-digital phase-locked loop of claim 1, further comprising a clock generator configured to generate a first clock signal, a second clock signal and a third clock signal by using the reference signal, output the first clock signal to the time-to-digital conversion circuit, and output the second clock signal and the third clock signal to the digital loop filter.

7. The all-digital phase-locked loop of claim 6, wherein the time-to-digital conversion circuit outputs the first data signal and the second data signal to the digital loop filter in response to the first clock signal.

8. The all-digital phase-locked loop of claim 6, wherein the digital loop filter
outputs, as the first register signal, a first operation signal of a first operation circuit to a second operation circuit in response to the second clock signal, and
outputs, as the control signal, a second operation signal of a second operation circuit to the digitally controlled oscillator in response to the third clock signal.

9. An all-digital phase-locked loop comprising:
a clock generator configured to generate a first clock signal, a second clock signal and a third clock signal by using a reference signal;
a first time-to-digital conversion circuit configured to output a first data signal corresponding to a first digital value when the reference signal has an earlier phase than a feedback signal in response to the first clock signal;
a second time-to-digital conversion circuit configured to output a second data signal corresponding to a second digital value when the reference signal has a later phase than the feedback signal in response to the first clock signal;
a digital loop filter configured to perform an operation by using the first data signal or the second data signal in response to the second clock signal and output an operation signal as a control signal in response to the third clock signal; and
a digitally controlled oscillator configured to control a frequency of an oscillation signal and output the oscillation signal in response to the control signal.

10. The all-digital phase-locked loop of claim 9, wherein the first time-to-digital conversion circuit comprises:
a positive time-to-digital converter configured to convert a phase difference between the reference signal and the feedback signal into the first digital value;
a first encoder configured to convert the first digital value into a binary number; and
a first register configured to store the binary number of the first encoder and output the stored binary number as the first data signal in response to the first clock signal.

11. The all-digital phase-locked loop of claim 9, wherein the second time-to-digital conversion circuit comprises:
a negative time-to-digital converter configured to convert a phase difference between the reference signal and the feedback signal into the second digital value;
a second encoder configured to convert the second digital value into a binary number; and
a second register configured to store the binary number of the second encoder and output the stored value as the second data signal in response to the first clock signal.

12. The all-digital phase-locked loop of claim 9, wherein the digital loop filter comprises:
a selection circuit configured to select one of the first data signal and the second data signal as valid data;
a first operation circuit configured to output a first operation signal by operating the valid data and a first register signal;
a first register circuit configured to store the first operation signal and output the first operation signal as the first register signal in response to the second clock signal;
a second operation circuit configured to output a second operation signal by operating a value of at least one bit of the valid data and the first register signal; and
a second register circuit configured to store the second operation signal and output the second operation signal as the control signal in response to the third clock signal.

13. The all-digital phase-locked loop of claim 12, wherein the first operation circuit and the second operation circuit each operate as an adder when the reference signal has an earlier phase than the feedback signal.

14. The all-digital phase-locked loop of claim 12, wherein the first operation circuit and the second operation circuit each operate as a subtractor when the reference signal has a later phase than the feedback signal.

15. The all-digital phase-locked loop of claim 9, further comprising a divider configured to divide the oscillation signal and output the feedback signal to the first time-to-digital conversion circuit and the second time-to-digital conversion circuit.

* * * * *